(12) United States Patent
Kondo

(10) Patent No.: US 7,632,752 B2
(45) Date of Patent: Dec. 15, 2009

(54) METHOD OF MANUFACTURING A COMPOSITE OF COPPER AND RESIN

(75) Inventor: Masaki Kondo, Niigata (JP)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 217 days.

(21) Appl. No.: 11/827,687

(22) Filed: Jul. 13, 2007

(65) Prior Publication Data

US 2008/0026565 A1    Jan. 31, 2008

(51) Int. Cl.
*C23G 5/02* (2006.01)
*B05D 3/10* (2006.01)

(52) U.S. Cl. .......................... 438/637; 438/629; 134/3; 427/299

(58) Field of Classification Search ........................ None
See application file for complete search history.

(56) References Cited

U.S. PATENT DOCUMENTS

| 6,346,678 B1 * | 2/2002 | Kono et al. | ............. 174/255 |
| 7,025,867 B2 * | 4/2006 | Czeczka et al. | ............. 205/159 |

\* cited by examiner

*Primary Examiner*—Zandra Smith
*Assistant Examiner*—Pamela E Perkins
(74) *Attorney, Agent, or Firm*—John J. Piskorski

(57) ABSTRACT

A metallic copper and resin composite body manufacturing method of forming a copper wiring layer that forms an inner layer circuit, establishing an insulating layer with a resin on said wiring layer, forming via holes which expose the copper surface under the insulative layer, and depositing a metal on the copper surface that is exposed at the bottom of the via holes. The method includes a step of: removing copper oxide which forms on the surface of the copper that is exposed in the bottom of the via holes using a phosphoric acid aqueous solution with a pH between 1 and 3. The method suppresses haloing is and via holes with excellent solder bonding are formed.

7 Claims, No Drawings

METHOD OF MANUFACTURING A COMPOSITE OF COPPER AND RESIN

The present invention relates to a manufacturing method for a composite body having a copper metal layer and an insulative layer on the surface, and in particular to a manufacturing method for a semiconductor substrate having a copy wiring layer on the surface, and also to a cleaning method thereof.

In the field of electronic materials such as multiple layer wiring boards and semi-conductor devices, there are demands for reducing the size of semiconductor substrates and printed wiring boards which are used in electronic devices that are becoming more compact. In order to meet these demands, printed wiring boards and semiconductor substrates are made to be more dense by making the circuitry thereof more detailed and multilayered. A known method to increase the wiring density is to form an insulative layer on the surface of a substrate that forms an inner layer circuit, form holes in this insulative layer, deposit metal in these holes, and thereby contact holes or via holes are formed which can connect between the substrate and the wiring and also between wiring layers.

With printed wiring boards which are required to have adhesion between a metal wiring layer and an insulative resin layer, a darkening process is known wherein a metal wiring layer is formed on the surface of the substrate or a first insulative layer, and metallic copper which is the metal wiring layer is oxidized, and thereby a film of copper oxide (cupric oxide) is formed on the surface thereof, and hence the adhesion to the insulative resin layer which is formed on the metal wiring layer is increased. With this method, fine protrusions are formed on the surface of the oxidized copper oxide film in order to increase the adhesion to the resin. However, cupric oxide is easily dissolved in acid, and is therefore dissolved by the acid in the plating solution when in contact with an electroless plating solution or an electroplating solution that is used to provide conductivity to the via holes that are formed in the insulative resin layer, and therefore so-called haloing occurs where a gap (void) is formed at the interface with the metallic copper at the via hole. As a means for resolving this problem, a method of preventing the occurrence of haloing using specific processing solutions and a method of reducing the cupric oxide film has been proposed in Japanese patent application H6-275952.

On the other hand, the darkening process that was used with a printed wiring board is not used with a semiconductor substrate. The method of forming a conventional via hole is to form metal wiring on the surface of a substrate, deposit and inter-layer insulative layer, and then exposing and developing to form via holes by establishing grooves or holes in the inter-layer insulative layer. Furthermore, via holes can also be formed by uniformly depositing a liquid photosensitive inter-layer insulative material on the metal wiring, and then exposing and developing in order to form via holes by establishing a groove or hole in the inter-layer or insulative layer. In order to form the inter-layer insulative layer with a uniform film thickness, a screen printing method, curtain coating method, or spin coating method, or the like, have conventionally been used.

With a conventional semiconductor substrate manufacturing method, the process of manufacturing via holes is to form the via, and then oxidize the surface thereof by exposing the surface of the copper wiring layer to outside atmospheric air, and forming a copper oxide layer. Furthermore, if a liquid photosensitive resin material is used, a thermal hardening process is performed after the developing process. The copper oxide film is insulative, so the copper oxide film must be removed prior to conductivity processing such as electroless plating, or the like, in order to restore the electrical conductivity of the via hole. Conventionally, a sulfuric acid aqueous solution, or the like, is used in order to treat the copper oxide film on the bottom of the via hole, but depending on the type of resin in the insulative layer, this may cause haloing similar to the case of a printed wiring board. The occurrence of haloing causes problems with a reduction in adhesion in addition to problems with a reduction in the reliability of the semiconductor substrate.

An object of the present invention is to manufacture a semiconductor substrate with high reliability by removing the copper oxide layer that is formed in the bottom of a via hole without causing haloing for the case where copper metal is used as a wiring layer when manufacturing a semiconductor substrate.

As a result of diligent research into a method to clean and remove the copper oxide layer that is formed in the bottom of via holes during the manufacturing process of a composite body which has an insulative resin layer and a copper layer as a metallic wiring layer, the present inventors have discovered that copper oxides can be effectively removed without the occurrence of haloing by using an aqueous solution with phosphoric acid as the main component, and have thus achieved the present invention.

As one aspect, the present invention provides a manufacturing method for a semi-conductor substrate that uses copper metal as metal wiring wherein copper oxides which are formed on the surface of the copper metal are removed by using an aqueous solution containing phosphoric acid, and if necessary, an organic acid, a pH adjusting agent, and a surfactant.

According to the method of the present invention, copper oxides which form on the surface of the copper metal that is exposed in the bottom of the via holes and on the copper wiring which are not protected by the insulative resin layer can be removed by bringing the copper oxide layer into contact with a phosphoric acid aqueous solution, and therefore the adhesion and electrical conductivity between the metal that is subsequently deposited and the copper wiring will be favorable. Furthermore, the phosphoric acid aqueous solution of the present invention does not readily corrode copper metal, and can therefore prevent the occurrence of haloing because the phosphoric acid aqueous solution does not easily penetrate into the interface between the copper wiring layer and the insulative resin layer.

The phosphoric acid aqueous solution of the present invention comprises phosphoric acid and water, and may also comprise an adjuvant acid if necessary, a pH adjusting agent, and a surfactant. However, from the viewpoint of preventing the occurrence of haloing, the phosphoric acid aqueous solution of the present invention preferably does not contain an inorganic acid such as sulfuric acid, hydrochloric acid, nitric acid, or hydrofluoric acid, or the like.

The phosphoric acid of the present invention can be phosphoric acid (orthophosphoric acid ($H_3PO_4$)) or a polyphosphoric acid such as pyrophosphoric acid, and the like.

The adjuvant acid supports the phosphoric acid in achieving the effects of the present invention will be difficult or impossible if this acid is used alone in place of the phosphoric acid, and examples of these acids are organic acids such as acetic acid, benzoic acid, benzenesulfonic acid, and methanesulfonic acid, and the like. These adjuvant acids do not include strong inorganic acids such as sulfuric acid.

The pH adjusting agent that can be used with the present invention is used in order to stabilize the pH of the phosphoric acid aqueous solution, and examples include phosphoric acid salts such as hydrogen disodium phosphate and trisodium phosphate, and the like. A similar effect can be obtained by adding sodium hydroxide to a phosphoric acid aqueous solution.

The surfactant of the present invention can be any one of a nonionic, cationic, anionic, or amphoteric surfactant. Preferably one or more types of nonionic surfactants are used. Examples of nonionic surfactants include alkyl alcohol ethylene oxide adducts, alkyl phenol ethylene oxide adducts, fatty acid ethylene oxide adducts, polyhydric alcohol fatty acid ester ethylene oxide adducts, alkylamine ethylene oxide adducts, polypropylene glycol ethylene oxide adducts, and polyhydric alcohol fatty acid esters, and the like. If the insulative layer that has the via holes is made from a hydrophobic resin, or if the diameter of the via holes is small, the importance of adding a surfactant to the phosphoric acid aqueous solution will increase.

The phosphoric acid aqueous solution of the present invention contains between 10 and 50 g/L, preferably between 15 and 30 g/L of phosphoric acid, between 0 and 50 g/L of an adjuvant acid, between 0 and 10 g/L, preferably between 1 and 5 g/L of a pH adjusting agent, between 0 and 20 g/L, preferably between 1 and 10 g/L of a surfactant, with the remainder being water. Preferably the water that is used is deionized water.

The preferred embodiment of the phosphoric acid aqueous solution of the present invention contains between 15 and 25 g/L of phosphoric acid, between 1 and 5 g/L of sodium hydroxide as a pH adjusting agent, and between 3 and 8 g/L of a nonionic surfactant, with the remainder being deionized water.

The phosphoric acid aqueous solution that is used with the present invention has a pH between 1 and 7, and preferably between 1 and 3.

The manufacturing method for the composite body comprising a copper wiring layer and an insulative layer according to the present invention can be a commonly known method. Herein, materials which can form the base of the composite body include glass, resin substrate, silicon wafer, ceramic substrate, and semiconductor wafer, and the like. In other words, a metal layer is deposited on the surface of the base of the composite body by electroless plating or sputtering, or the like, and the metal wiring layer is formed by a semi-additive method or an additive method, or the like. The metal that is used in the wiring layer is preferably copper. A photosensitive insulative resin composition can be used in order to form the insulative layer on the metal wiring layer. Either a liquid or a solid may be used, but preferably a liquid photosensitive insulative resin composition is used.

If a photosensitive resin composition is used as the insulative layer, in order for the photosensitive resin composition to have a uniform film thickness, after application, exposure is performed through a photomask that masks the areas where via holes or contact holes are desired or that masks other areas, and then the via holes are formed by developing using a developing solution which is generally an alkaline aqueous solution. If a liquid photosensitive resin composition is used, the copper or metal surface in the areas not covered by the insulative layer and at the bottom of the via holes will be oxidized during the heating process after forming the via holes, and therefore a copper oxide layer will be formed. Furthermore, after the via holes are formed, if the composite body is exposed to air, the copper metal surface of the copper wiring and the bottom of the via holes will similarly be oxidized by air and a copper oxide will be formed.

These copper oxides will have an effect on the conductivity with the sputter layer that is formed in a subsequent process, and on the adhesion to solder and solder wettability, so the copper oxide must be removed prior to these processes.

In order to remove these copper oxides before the solder plating process or the sputtering process in which metal is deposited on the copper wiring and via holes, the aforementioned phosphoric acid aqueous solution is brought into contact with the copper oxide layer. The method for causing contact with the phosphoric acid aqueous solution can be in a commonly known method, but a method of immersing the substrate in a phosphoric acid aqueous solution is preferable. Preferably the temperature of the phosphoric acid aqueous solution is between 0° C. and 70° C., preferably between 20° C. and 30° C. The contact time between the phosphoric acid aqueous solution and the copper oxide layer should be between 10 seconds and 10 minutes, preferably between 1 and 5 minutes.

Although getting caught up in the theory is not preferable, the phosphoric acid aqueous solution of the present invention is thought to have the following function. In other words, when the copper oxide on the copper metal comes in contact with the phosphoric acid aqueous solution, the copper oxide is dissolved by the action thereof. When the phosphoric acid aqueous solution comes in contact with the copper metal that is exposed in the regions where the copper oxide has been removed, the copper metal and a phosphoric acid will react to form a copper phosphate film. Further dissolving of the copper will be stopped by the formation of this copper phosphate film, and therefore it is thought that the occurrence of haloing is prevented. This copper phosphate film is thought to be only present in an aqueous solution, and after the copper metal is removed from contact with the phosphoric acid aqueous solution, a copper oxide will again form on the surface after exposure to an oxidizing agent such as the oxygen in the air for long period of time. Therefore, with the method of the present invention, after the copper oxide layer is dissolved by the phosphoric acid aqueous solution, the next process such as deposition of metal must be performed prior to the copper oxide again forming on the surface of the copper.

A copper sputter wafer was prepared by depositing copper to a thickness of 3000 angstroms by sputtering on the surface of a 4 inch silicon wafer. A 10 μm thick copper layer was then deposited thereon using a commonly known electrolytic copper plating solution, and then annealing was performed for one hour at 150° C. The wafer with the electrolytic copper plating layer was immersed for one minute in a 10% sulfuric acid aqueous solution (23° C.), and then water washed for 30 seconds at 23° C. in order to clean the surface. Next, an insulative resin layer and via holes were formed on the wafer surface by the following process using a liquid epoxy-based photosensitive insulative resin.

The liquid photosensitive insulative resin was applied to the wafer by spin coating for 30 seconds at 1500 rpm, a pre-bake was performed for 30 minutes at 90° C., exposure was performed using 1000 mJ/cm$^2$ energy, and then thermal processing (PEB) after exposure was performed for 30 minutes at 90° C. A 300 micron diameter via hole was formed by developing using a 2.38% tetramethyl ammonium hydroxide (TMAH), preliminary hardening was performed for 30 minutes at 130° C., and then thermal hardening was performed at 200° C. for 60 minutes to form an insulative resin layer with via holes.

A test board with the copper wiring exposed at the bottom of the via holes which was prepared as described above was washed with a phosphoric acid aqueous solution prepared as shown below.

The phosphoric acid aqueous solution of the present invention was prepared as shown below. The pH of the phosphoric acid aqueous solution that was prepared was 2.1.

Component: amount phosphoric acid (85%): 25.35 g/L sodium hydroxide aqueous solution: 3.53 g/L (as sodium hydroxide)

surfactant 1: 5.25 g/L
surfactant 2: 0.75 g/L
deionized water: remainder
surfactant 1:
    Nona 1912A produced by Toa Chemical Industries (polyoxyalkylene arylphenyl ether)
surfactant 2:
    LAOL XA-60-50 produced by Lion Corporation (polyethylene glycol nonyldecylundecyl ether)

The cleaning process was performed by immersing the test board in the aforementioned phosphoric acid aqueous solution at 23° C. for either 1 minute or 5 minutes. The test board was washed in water and dried by blowing with nitrogen, and then the presence of haloing was measured by observing with a microscope. The width of the haloing observed is shown in Table 1. Next, a solder ball (63 Sn-37 Pb) with a diameter of 450 microns was placed in the via holes using flux, and reflowing was performed for 10 seconds at 260° C. A solder shear test was performed using a Dage 4000 shear tester, and the fracture mode of the solder was observed. The results are shown in Table 1.

COMPARATIVE EXAMPLE 1

A test similar to that of Embodiment 1 was performed with the exception that a 10% sulfuric acid aqueous solution was used in place of the phosphoric acid aqueous solution. The pH of the aqueous solution was less than 1. The results are shown in Table 1.

COMPARATIVE EXAMPLE 2

A test similar to that of Embodiment 1 was performed with the exception that a 5% sulfuric acid aqueous solution was used in place of the phosphoric acid aqueous solution. The pH of the aqueous solution was less than 1. The results are shown in Table 1.

COMPARATIVE EXAMPLE 3

A test similar to that of Embodiment 1 was performed with the exception that a processing liquid was used which contained 5 vol % of sulfuric acid in addition to the phosphoric acid aqueous solution of Embodiment 1. The pH of the aqueous solution was less than 1. The results are shown in Table 1.

COMPARATIVE EXAMPLE 4

A test similar to that of Embodiment 1 was performed with the exception that treatment with a phosphoric acid aqueous solution was not performed. The results are shown in Table 1.

TABLE 1

|  | Immersion time | Haloing width (μm) | Solder Bonding |
| --- | --- | --- | --- |
| Embodiment 1 | 1 minute | 0 | Good |
|  | 5 minutes | 0 | Good |
| Comparative Example 1 | 1 minute | 23.1 | Good |
|  | 5 minutes | 76.3 | Good |
| Comparative Example 2 | 1 minute | 22.8 | Good |
|  | 5 minutes | 73.4 | Good |
| Comparative Example 3 | 1 minute | 17.2 | Good |
|  | 5 minutes | 49.2 | Good |
| Comparative Example 4 | None | 0 | Poor |

When manufacturing a semiconductor substrate with copper wiring according to the present invention, the occurrence of haloing was suppressed, and excellent solder bonding could be achieved, and a semiconductor substrate with high reliability could be provided.

What is claimed is:

1. A metallic copper and resin composite body manufacturing method of forming a copper wiring layer that forms an inner layer circuit, establishing an insulating layer comprising a resin on said wiring layer, forming via holes which expose the copper surface under said insulative layer, and depositing a metal on the copper surface that is exposed at the bottom of said via holes, comprising a step of: removing copper oxide which forms on the surface of the copper that is exposed in the bottom of said via holes using a phosphoric acid aqueous solution with a pH between 1 and 3, wherein said phosphoric acid aqueous solution consists of phosphoric acid, sodium hydroxide, surfactant, and water.

2. The method according to claim 1, wherein said insulative layer is formed on the copper wiring layer without performing a surface roughening process.

3. The method according to claim 1, wherein after processing with said phosphoric acid aqueous solution, said metal is deposited before copper oxides form on said copper surface.

4. The method according to claim 1, wherein the metal that is deposited on the copper layer is deposited by electroless metal plating, and simultaneously a metal layer is formed on said resin.

5. The method according to claim 4, wherein a surface roughening process is not performed on said copper wiring layer.

6. A semiconductor substrate manufacturing method of forming a copper wiring layer that forms an inner layer circuit, establishing an insulating layer comprising a liquid resin on said wiring layer, forming via holes which expose the copper surface in said insulative layer, and depositing a metal on the copper surface that is exposed at the bottom of said via holes, comprising a step of: removing copper oxide which forms on the surface of the copper that is exposed in the bottom of said via holes using a phosphoric acid aqueous solution, wherein said phosphoric acid aqueous solution consists of phosphoric acid, sodium hydroxide, surfactant, and water.

7. A cleaning method for semiconductor substrate which have an insulative layer with via holes with a portion of the bottom of the via holes exposed, wherein copper oxide which forms on the surface of the copper in the bottom of said via holes is removed by a cleaning solution consisting of phosphoric acid, sodium hydroxide, surfactant, and water.

* * * * *